United States Patent [19]

Masters et al.

[11] Patent Number: 4,799,044

[45] Date of Patent: Jan. 17, 1989

[54] PHOTOTRANSISTOR APPARATUS WITH CURRENT INJECTION AMBIENT COMPENSATION

[75] Inventors: Timothy E. Masters, Georgetown; Wayne J. Wehrer, Austin, both of Tex.

[73] Assignee: AMP Incorporated, Harrisburg, Pa.

[21] Appl. No.: 83,321

[22] Filed: Aug. 6, 1987

Related U.S. Application Data

[62] Division of Ser. No. 830,408, Feb. 18, 1986, Pat. No. 4,713,534.

[51] Int. Cl.$^4$ ............................................. G08C 21/00
[52] U.S. Cl. ........................................ 341/5; 340/712; 250/214 B; 250/221; 341/31
[58] Field of Search ............ 340/365 P, 365 VL, 712; 250/214 C, 214 B, 214 AL, 214 R, 221; 178/18

[56] References Cited

U.S. PATENT DOCUMENTS

| | | | |
|---|---|---|---|
| 4,128,760 | 12/1978 | Del Signore, II | 250/214 B |
| 4,198,623 | 4/1980 | Misek et al. | 340/712 |
| 4,341,956 | 7/1982 | Bax | 250/214 C |
| 4,591,710 | 5/1986 | Komadina et al. | 250/214 C |
| 4,701,609 | 10/1987 | Koishi et al. | 250/214 C |
| 4,707,689 | 11/1987 | DiPiazza et al. | 250/214 B |

OTHER PUBLICATIONS

"Automatic Ambient Light & Dark Current Compensation of Photosensor", Chien et al, IBM Tech. Dis. Bulletin, 10/77.

Primary Examiner—John W. Caldwell, Sr.
Assistant Examiner—Tyrone Queen
Attorney, Agent, or Firm—Robert W. Pitts

[57] ABSTRACT

A current injection compensation circuit for dynamically compensating for the effect of ambient conditions on phototransistor output is disclosed. An output voltage is maintained at a nominal reference voltage level independent of ambient light input to allow use of a large output for a detected signal. Phototransistor current is a function only of ambient conditions, especially incident ambient light and is unaffected by compensation current injection. The ambient compensation current injection network can be employed with interactive touch input devices, such as infrared touch entry systems used with video displays.

6 Claims, 7 Drawing Sheets

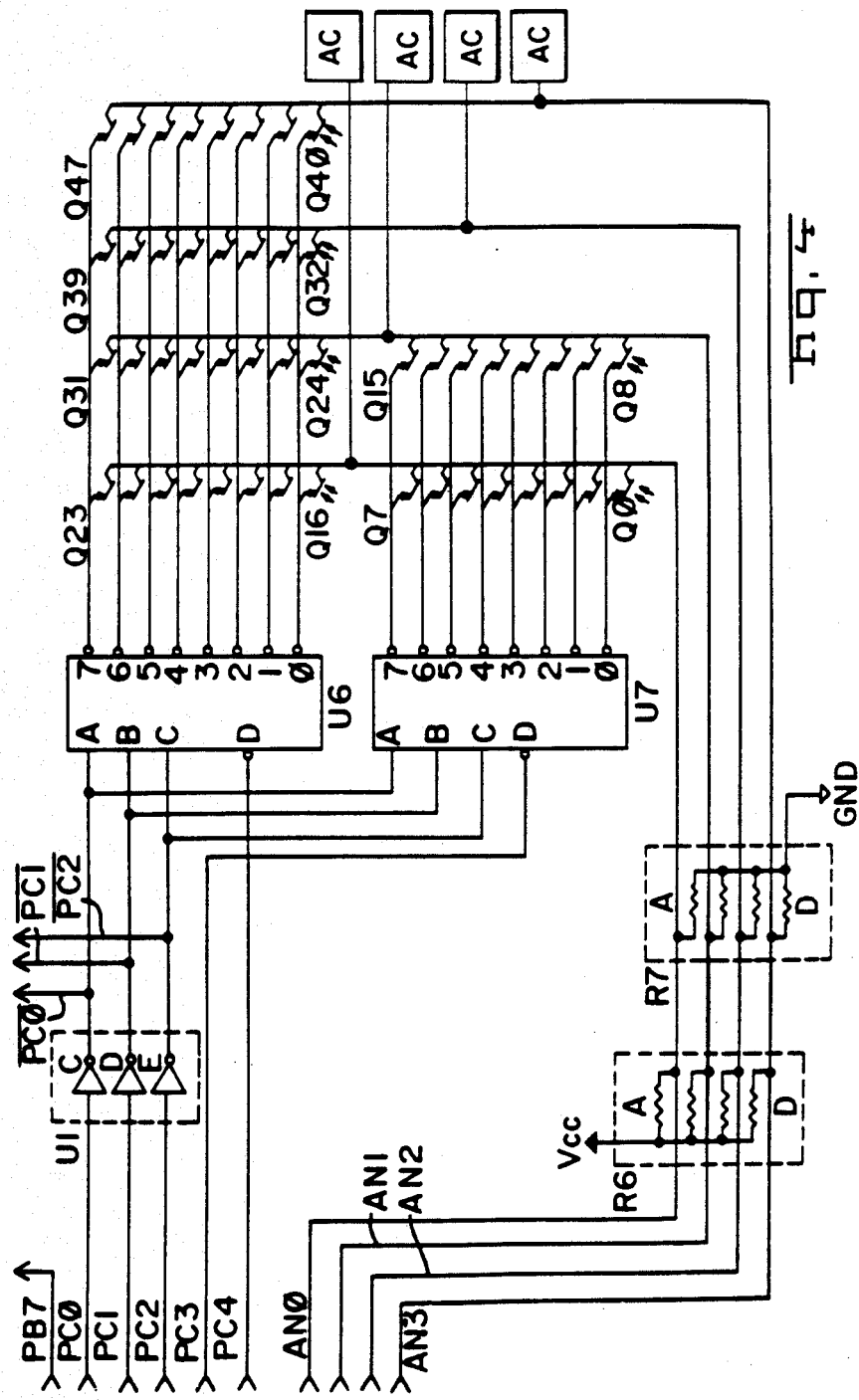

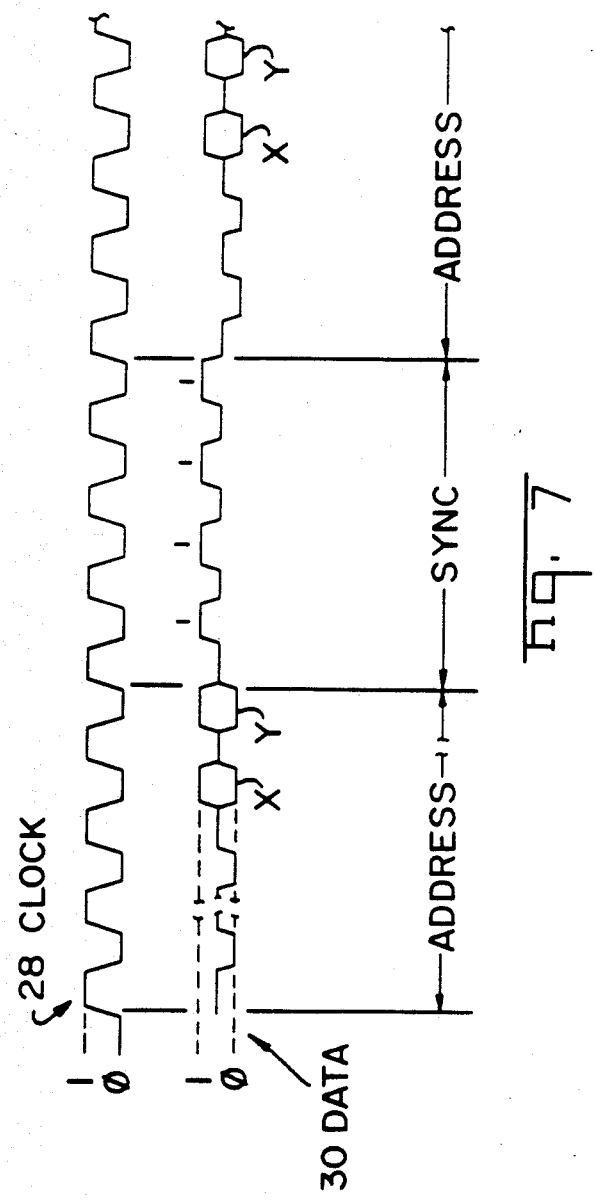

PHOTOTRANSISTOR APPARATUS WITH CURRENT INJECTION AMBIENT COMPENSATION

This is a division of application Ser. No. 830,408 filed Feb. 18, 1986 now U.S. Pat. No. 4,713,534.

BACKGROUND OF THE INVENTION

1. Field of the Invention

This invention relates to the use of phototransistors employed for the detection of variable light signals. This invention can be employed in conjunction with the detection of visible light signals, although it is primarily intended for use in detecting infrared signals. The preferred embodiment of this invention provides a means for detecting varying infrared LED pulses while compensating for ambient conditions, such as excitation of the phototransistor by ambient light. Although this invention can be employed with single emitter—phototransistor pairs, it is especially adapted for use with systems having a large number of pairs. The preferred embodiment of this invention is suitable for use in systems in which the emitter—phototransistor pairs are scanned at rapid rates. Although this invention would be suitable for use in applications such as invisible light barriers used for safety around machinery or as anti-intrusion barriers, the invention is especially adapted for and is depicted in use with a touch entry system used to input data through a video display.

2. Description of the Prior Art

Coincident with the use of video displays has always been the problem of the man/machine interface. Traditionally, control of displayed information or cursors has been via a keyboard. Recently, however, a number of devices have been introduced which allow an operator to directly interact with the video display. These types of devices have included light pens, desk-type mouse controllers, or touch input devices such as a switch matrix or opto-electronic matrices. While generally switch-type overlays, placed adjacent a video display, are inexpensive to apply and utilize, they are generally susceptible to contact wear as well as distortion of the video information which is presented to the viewer, particularly in high usage environments. However, since opto-matrix schemes utilize light, which is generally in the infrared region, the switch matrix presented by the light beams is invisible to the viewer and, therefore, does not distort the video information displayed to the viewer and is not subject to wear in high usage environments. A number of schemes which utilize opto-matrix frames may be found in U.S. Pat. No. 4,267,443 "Photoelectric Input Apparatus", issued May 12, 1981 to Carroll et al; and U.S. Pat. No. 3,764,813 "Coordinate Detection System", issued Oct. 9, 1973 to Clement et al. These three schemes address problems inherent with opto-matrix devices such as increasing frame resolution without a corresponding increase in components, surrounding or ambient light compensation, or optimization of emitter/detector driving and detecting networks respectively. These systems still have drawbacks. Large component usage results in higher costs. Some systems exhibit difficulty in compensating for reflection or glare resulting in styli hits which are not recorded. Glare problems generally occur when an emitter is adjacent the corner of the frame or bezel such that light produced by the emitter bounces off an adjacent surface and is then detected by the detector. It follows that a stylus which is introduced to the video display may block the majority of the light received by the detector, but the amount of reflected light may be sufficiently great that the detector and its associated circuitry do not perceive a hit.

Ambient light also results in significant problems. Several systems for ambient light compensation have been proposed, and some are marketed in touch entry systems. For example, U.S. Pat. No. 4,267,443 discloses an ambient light sampling system. U.S. Pat. No. 3,970,846 discloses an ambient light compensation feedback loop for affecting the bias voltage at the base of a phototransistor. Commonly assigned U.S. patent application Ser. No. 621,585 filed June 18, 1984, and incorporated herein by reference, discloses a digital ambient light sampling approach. It is desirable to have a device which minimizes the number of components necessary for addressing and detecting emitters and detectors. It is also desirable that the device dynamically compensates for ambient light and for variations in emitter output and detector sensitivity. At the same time the device should employ a minimal number of components for addressing and detecting emitters and detectors. Such a scheme is taught in the present invention.

It is a principal object of the invention to provide a practical touch input device comprising a four-sided frame, optical emitters disposed in two adjacent sides of the frame, optical detectors disposed in the two sides of the frame opposite the emitters, and sampling device for sequentially sampling the light received by the detectors. The system should also include an ambient compensation network for maintaining the output level of ambient induced signals from phototransistors within the phototransistor operating range while permitting the signal detection gain to be sufficiently large to permit reliable and easy detection of a pulsed signal.

An object of this invention is to arrive at a cost effective compensation technique to neutralize the effects of ambient light in the phototransistor biasing network. Ambient light alters the operating level of the bias network and effectively limits the system dynamic range. The variance of this operating level, as a function of ambient light, limits the gain at which the phototransistor can be operated. With compensation, this gain can be increased significantly. Additionally, the dynamic operating range can be increased and a wider range of devices will be acceptable.

SUMMARY OF THE INVENTION

A phototransistor detection circuit and system for use in conjunction with a varying light source is used to compensate for ambient conditions, especially the excitation of phototransistors by the incidence of ambient light. Current is injected at the collector of the phototransistors to adjust the reference voltage at the node between two resistors of a voltage divider to compensate for ambient light signals. The current in the phototransistor flowing out of the reference voltage node, is a function only of light striking the base of the phototransistor. Therefore, a varying injection current will adjust the reference voltage at the node. In the preferred embodiment of the invention, the reference voltage is adjusted to a nominally constant operating level. This adjustment makes a greater percentage of the phototransistor operating range available for detection of the varying output signal intensity. The gain on the output signal can, therefore be greater because a nominal dynamic range is maintained. The injected current is regulated by feedback in which a signal due to ambient excitation is dynamically compensated in a closed loop. This ambient signal is held during LED excitation time to allow normal signal excursion. The ambient signal is used to regulate a current compensation source, which in turn injects current at the reference voltage node. The ambient compensation network is especially suitable for use in a device, such as an optical touch input system, in which an illuminated field, formed by optical emitters and detectors positioned on the periphery of the field, is interrupted by an opaque element or stylus, such as a finger.

BRIEF DESCRIPTION OF THE DRAWINGS

Reference is now made to the accompanying drawings in which:

FIGS. 2, 3 and 4 are schematic diagrams for use in conjunction with the touch input entry device employing ambient light compensation.

DESCRIPTION OF THE PREFERRED EMBODIMENT

Construction of the Present Device

The invention is described in terms of a touch entry system suitable for use in conjunction with a video display. The ambient light compensation system is depicted in use with a digital touch entry system. It should be understood, however, that the invention can be used to compensate for ambient conditions in other types of touch entry systems as well as in other systems employing individual emitter—detector pairs or a plurality of sequentially activated emitter—detector pairs.

Figure 1:
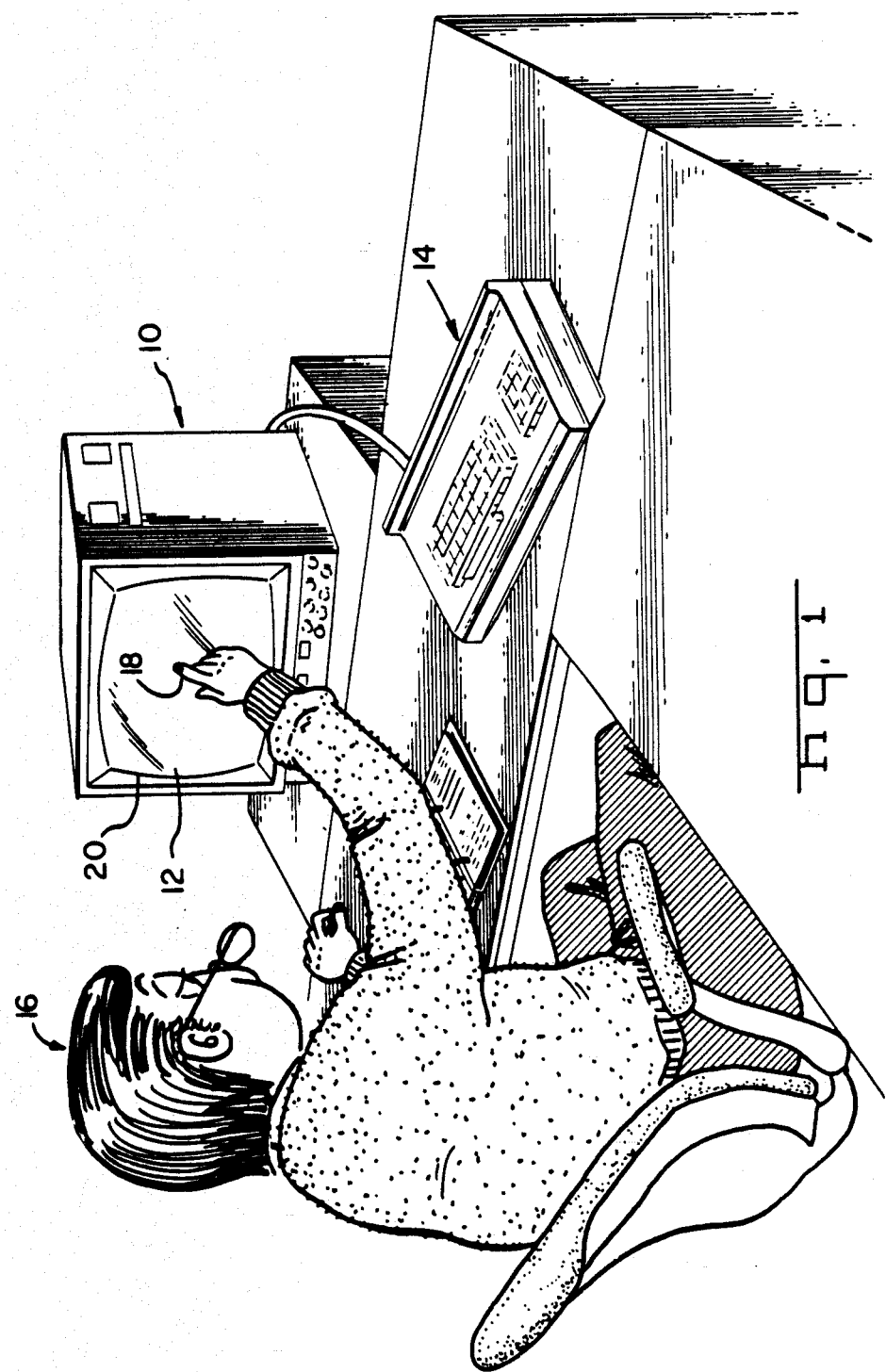
FIG. 1 is a representative view of an operator utilizing a video display.

Referring now to FIG. 1, there is illustrated a representative view of an operator utilizing a video display. Shown is a CRT 10 having a display area 12, which generally interacts with a keypad or keyboard 14. An operator 16 interacts with the display area 12 through the use of the stylus 18, which with the preferred embodiment of the present invention, is the finger of the operator, thereby presenting a truly touch-type interactive system. It is to be understood, however, that other types of styli or opaque elements can and may be used in touch-type interactive systems such as, for example, pencils, pointers, or other similar types of apparatus. While the keypad 14 is shown, touch entry systems permit minimal use of the keypad 14, with the operator 16 utilizing the stylus 18 for direct interaction with the CRT. A touch input area is generally defined by what the operator 16 sees in the display area 12. In the preferred embodiment of the present invention, this touch area, or illuminated field, utilizes emitters and detectors disposed on the periphery of the field. Emitters are disposed on the bottom and one side of the display with detectors located on the top and opposite side, thereby forming an infrared light beam matrix or illuminated field (shown more clearly in FIG. 6). The light beams shine through the bezel 20 which is disposed around the edge of the CRT 10 and which, in the preferred embodiment of the present invention, is opaque to visible light but transparent to infrared light. It is to be understood however, that other types of bezels which exhibit different types of light transmission properties may be utilized.

Figure 2:
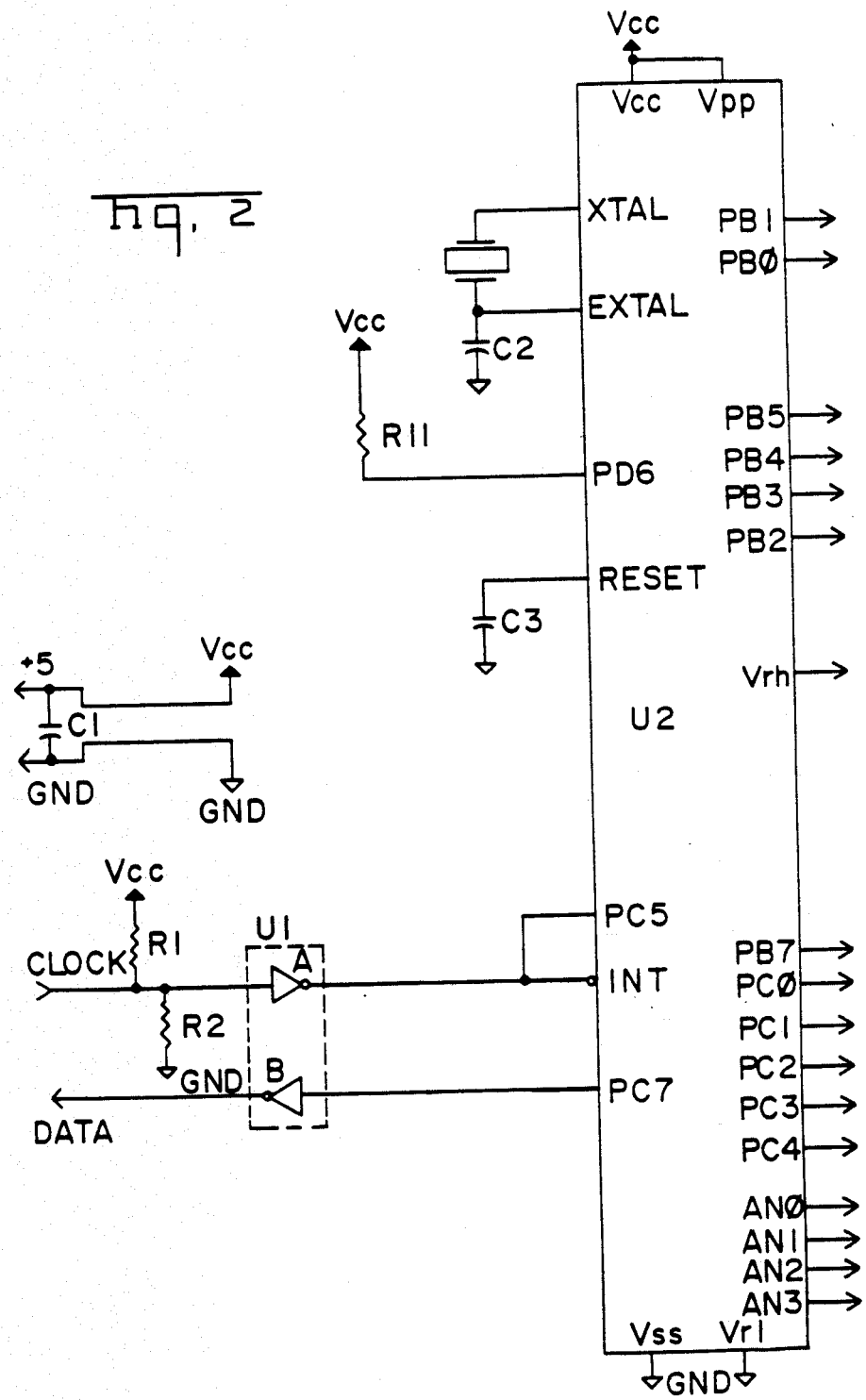

Referring now to FIGS. 2, 3 and 4, there is illustrated a schematic for a touch entry device in which the ambient compensation system of the present invention can be employed. A list of the major component designations and functions is shown in Table 1 below.

TABLE 1

| Component Number | Component Type |
|---|---|
| U1 | Schmidt Trigger Inverter |
| U2 | Microprocessor |
| U3, U4, U8, U9 | Darlington Transistor Array |
| U5, U6, U7 | BCD-to-Decimal Decoder |
| CR0-CR47 | Light Emitting Diodes (Emitters) |
| Q0-Q47 | Phototransistors (Detectors) |
| AC | Ambient Light Compensation Network |

Microprocessor U2 represents an 8-bit microcomputer having on-board analog-to-digital converter as well as RAM and ROM, and is an HMOS device preferably of the 6800 family of microcomputers produced by companies such as Motorola, of Austin, Tex. It is to be understood, however, that other types of microcomputers can be utilized. CMOS or MNOS microcomputers which have been produced by other manufacturers having different bit-byte configurations such as 16 or 32-bit bytes would be suitable for use. These machines, like the preferred 6800 family architecture, are known and readily available to one skilled in the art.

The design of the present invention does not require the use of all features and pins attendant to the U2 microprocessor, and therefore, only those utilized as shown and discussed. The Vcc terminal is connected to Vcc power which, in the preferred embodiment of the present invention, is +5 volts and is also connected to terminal Vpp. Vcc supplies operating power to most of the microprocessor U2 while Vpp supplies the programming voltage for the ROM memory in the microprocessor U2 which, in the preferred embodiment of the present invention, is EPROM. Masked versions of the microprocessor may also be utilized, in which case Vpp is no longer necessary.

The XTAL and EXTAL terminals have a crystal disposed therebetween with the EXTAL terminal having one terminal of capacitor C2 connected thereto with the remaining terminal of capacitor C2 connected to Ground (Gnd). This thereby provides a stabilized clock frequency for the entire system of the present invention. The RESET terminal is connected to one terminal of capacitor C3 with the remaining terminal of capacitor C3 also connected to Gnd. Terminal PC5, which is an I/O pin, is connected to the interrupt terminal INT and is connected to the output of the A inverter of device U1 which is a Schmidt-type trigger inverter with the input to inverter A of component U1 being connected to one terminal of R1 and one terminal of R2 as well as to the clock terminal which is thereafter provided by a host computer (not shown). The remaining terminals of R1 and R2 are connected to Vcc and Gnd respectively. The I/O pin PC7 is connected to the input of the B inverter of device U1 with the output of the B inverter of device U1 being a data output terminal which is also connected to a host computer (not shown). Also shown on FIG. 2 is capacitor C1 which acts as a filtering capacitor and is connected such that one terminal is attached to the +5 or Vcc bus with the other terminal attached to the Gnd bus. Port B I/O lines PB0, PB1, PB2, PB3, PB4, PB5 and PB7 provide coding and decoding for the emitters and detectors of the present invention as shown more clearly in FIGS. 3 and 4. Pin Vrh is a voltage reference high pin which provides the high voltage reference for the analog/digital conversion portion of the microprocessor U2. The Vrl pin is a voltage reference low pin which provides the low reference voltage for the analog-to-digital portion of the microprocessor U2. Port C terminals PC0, PC1, PC2, PC3 and PC4 are I/O pins which interconnect with the coding and decoding of the emitter/detector array as shown more clearly in FIGS. 3 and 4. Analog-to-digital terminals AN0, AN1, AN2 and AN3 are interconnected with the detection circuitry as shown more clearly in FIG. 4. The Vss terminal of the microprocessor U2 is connected to Gnd, WHILE I/O pin PD6 is connected to one terminal of resistor R11. The remaining terminal of resistor R11 is connected to Vcc.

Referring now to FIG. 3, the emitter portion of the present invention is shown. The PB0 line is connected to one terminal of resistor A of resistor network R3 as well as to the base terminal of one of the Darlington transistor pairs of component U3, a Darlington transistor array, while I/O line PB1 is connected to resistor B of resistor network R3 which is in turn connected to the base of another Darlington transistor pair of component U3. Similarly, I/O lines PB2, PB3, PB4 and PB5 are connected to resistors F, E, D and C respectively of resistor network R3 as well as to a base terminal of the Darlington transistor pair contained in component U4, also a Darlington transistor array. The remaining terminals of transistors A, B, C, D, E and F of resistor network R3 are tied together and thereafter to Vcc. The I/O line PB7 is connected to the D input of component U5 which is a binary coded decimal (BCD) to decimal decoder while PC0, PC1 and PC2 (supplied by component U1, not shown) are connected to the A, B and C inputs respectively of decoder U5. The collector terminal associated with the Darlington transistor pair for I/O line PB0 is connected to one terminal of resistor R10 while the collector terminal associated with the Darlington pair for I/O line PB1 is connected to one terminal of resistor R9. The remaining terminals of resistor R9 and R10 are thereafter connected to each other and to one terminal of resistor R8 and capacitor C4 as well as to all four of the collector terminals associated with the Darlington transistor array U4. The remaining terminal of capacitor C4 is connected to Gnd. The SUB terminals of Darlington transistor arrays U3 and U4 are connected to Gnd. The emitter terminal of the Darlington transistor pair associated with I/O line PB0 of component U3 is connected to the anode of emitters CR0, CR1, CR2, CR3, CR4, CR5, CR6 and CR7 while similarly the emitter of component U3 which is associated with the I/O line BP1 is connected to the anode of emitters CR8 through CR15.

The emitters in the preferred embodiment of the present invention are infrared light emitting diodes, although it is to be understood that other types of emitters can and may be utilized without departing from the spirit and scope of the present invention. Similarly, the emitter terminals associated with I/O lines PB2, PB3, PB4 and PB5 of Darlington transistor array U4 are connected to the anodes of emitters CR16-23, CR24-31, CR32-39 and CR40-47 respectively. The anodes of emitters CR7, CR15, CR23, CR31, CR39 and CR47 are connected to the collector terminal of one of the Darlington transistor pairs of U8 which is also a Darlington transistor array with the base terminal associated with this Darlington transistor pair being connected to terminal 7 of U5, a BCD-to-decimal decoder. Similarly, the cathodes of emitters CR6, CR14, CR22, CR30, CR38 and CR46 are connected to the collector terminal of another Darlington transistor pair of component U8 with the base terminal associated therewith being connected to output pin 6 of decoder U5. The cathodes of emitters CR5, CR13, CR21, CR29, CR37, and CR45 are connected to the collector terminal of a Darlington transistor pair of component U8 with the base terminal associated therewith being connected to pin 5 of decoder U5. The cathode terminals of emitters CR4, CR12, CR20, CR28, CR36 and CR44 are connected to the collector terminal of another Darlington transistor pair of array U8 with the base terminal associated therewith being connected to output pin 4 of decoder U5. The cathodes of emitters CR3, CR11, CR19, CR27, CR35 and CR43 are connected to the collector terminal of a Darlington transistor pair from component U9 which is another Darlington transistor array with the base terminal associated therewith being connected to output pin 3 of decoder U3. The cathodes of emitters CR2, CR10, CR18, CR26, CR34 and CR42 are similarly connected to a collector terminal of another Darlington transistor pair of array U9 with the base terminal associated therewith being connected to terminal 2 of decoder U5. The cathodes of emitters CR1, CR9, CR17, CR25, CR33 and CR41 are connected to the collector terminal of another Darlington transistor pair of array U9 with the base terminal associated therewith being connected to output pin 1 of decoder U5. The cathodes of emitters CR0, CR8, CR16, CR24, CR32 and CR40 are connected to the collector of another Darlington transistor pair contained in array U9 with the base terminal associated therewith being connected to output pin 0 of decoder U5. The emitter terminals and SUB terminals of array U8 are connected together and thereafter the Gnd while, similarly, the emitter and SUB terminals of array U9 are also connected together and thereafter the Gnd. Accordingly, through the use of arrays U3, U4, U8 and U9, the emitters CR0 through CR47 are connected so as to form a matrix (the operation of which will be described more fully below).

Referring now to FIG. 4, there is shown the detection and decoding circuitry associated with the detectors of the present invention. The I/O line PC0 is connected to the input of inverter C of component U1 while, similarly, I/O lines PC1 and PC2 are connected to the input of inverters D and E of component U1. This thereby produces PC0, PC1 and PC2 which is connected to terminals A, B and C respectively of decoder U5 (previously mentioned) as well as to terminals A, B and C respectively of binary coded decimal-to-decimal decoder U7 while I/O terminal PC4 is connected to the D terminal of decoder U6. Analog-to-digital I/O line AN0 is connected to one terminal of the A resistors of transistor arrays R6 and R7 and thereafter to the collector terminals of the phototransistors or detectors Q0, Q1, Q2, Q3, Q5, Q6, Q7 and Q16, Q17, Q18, Q19, Q20, Q21, Q22, Q23. Digital I/O line AN1 is similarly connected to one terminal of the B resistors of resistor networks R6 and R7 and thereafter connected to the collectors of detectors Q8 through Q15 and Q25 through Q31. The digital I/O line AN2 is connected to one terminal of the C resistors of resistor networks R6 and R7 and thereafter to the collectors of the detectors Q32 through Q39. Similarly, the I/O line AN3 is connected to one terminal of the D resistors of the resistor networks R6 and R7 and thereafter to the collectors of detectors Q40 through Q47. The remaining terminals of resistors A, B, C and D of R6 are connected together and thereafter to Vcc while the remaining terminals of resistors A, B, C and D of resistor network R7 are similarly connected together and thereafter to Gnd.

The output pin 0 of decoder U7 is connected to the emitter terminals of detectors Q0 and Q8 while similarly the paired emitter terminals of detectors Q1 and Q9, Q2 and Q10, Q3 and Q11, Q4 and Q12, Q5 and Q13, Q6 and Q14, Q7 and Q15 are are connected together and thereafter to terminals 1, 2, 3, 4, 5, 6 and 7 respectively of decoder U7. Additionally, the emitters of detectors Q16 and Q24 and Q32 and Q40 are connected together thereafter being connected to terminal 0 of decoder U6 while, similarly, the four emitters from detectors Q17 and Q25 and Q33 and Q41, Q18 and Q26 and Q34 and Q42, Q19 and Q27 and Q35 and Q43, Q20 and Q28 and Q44, Q21 and Q29 and Q37 and Q45, Q22 and Q30 and Q38 and Q46, Q23 and Q31 and Q39 and Q47 are connected together and thereafter to terminals 1, 2, 3, 4, 5, 6 and 7 respectively of decoder U6. This thereby creates a matrixing scheme similar to that of the detectors of FIG. 3.

Figure 5:
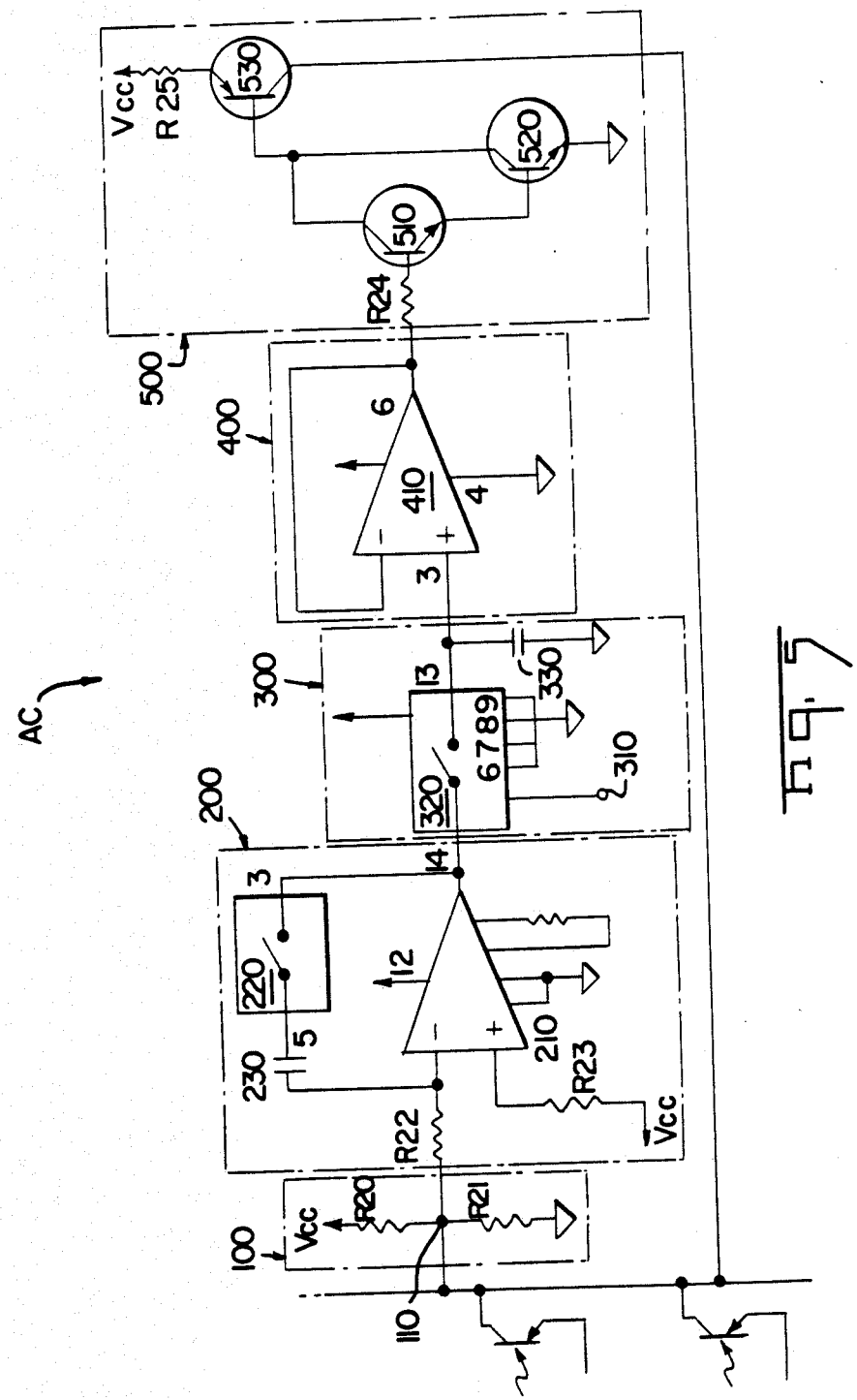
FIG. 5 shows the ambient compensation current injection network.

Electrical phototransistor compensation for ambient conditions, especially ambient light, is shown in FIGS. 4 and 5. The ambient compensation network AC comprises a feedback loop attached to the collector input of the phototransistors Q0 through Q40. The ambient compensation network comprises a voltage divider 100, an integrator 200, a sample and hold circuit 300, a buffer 400, and a current compensation source 500.

The voltage divider 100 comprises two resistors R20 and R21 on opposite sides of an intermediate reference voltage node 110. The voltage at reference voltage node 110 corresponds to the voltage at the collector of a phototransistor. Since the individual phototransistors comprising the detection circuit in the preferred embodiment of this invention are sequentially sampled, the voltage at reference node 110 would correspond to the voltage at the collector of the selected phototransistor, or phototransistors, at the particular interval in the cycle of operation of the apparatus. Resistor R20 is connected to a constant voltage source Vcc, while resistor R21 is connected to Ground.

The integrator 200 comprises a current mode (Norton) amplifier 210 with a capacitor 230 and an analog switch 220 in the integrator feedback loop. In the preferred embodiment of this invention, amplifier 210 comprises an LM359 current mode amplifier. Switch 230 comprises a conventional 4052 analog switch. The non-inverting terminal of the amplifier 210 is connected to a constant source of supply voltage Vcc through resistor R23. A representative value of Vcc would be +5 volts. The inverting terminal of the operational amplifier 210 is connected through a resistor R22 to a voltage reference node 110 of voltage divider 100.

The sample and hold circuitry 300 comprises a second conventional analog switch 320 and a capacitor 330 connected to Ground. In the preferred embodiment of this invention, switch 320 comprises a 4052 conventional analog switch.

Buffer 400 comprises a voltage follower having a high input impedance and a low output impedance. The high input impedance to buffer 400 is necessary to prevent loss of the signals stored on the capacitor 330 in the sample and hold circuit during the hold state, or stated differently, to prevent ambient signal droop. In the preferred embodiment of this invention, buffer 400 can employ a conventional CA3140 operational amplifier.

The current compensation source 500 comprises two npn transistors 510 and 520 configured as a Darlington-pair emitter follower. The collector of each of transistors 510 and 520 is in turn connected to the base of a pnp transistor 530. The emitter of pnp transistor 530 is attached to a constant supply of supply voltage Vcc through resistor R25. The collector output of the pnp transistor 530 is in turn attached to the reference node 110 and to the collector of the selected phototransistor. In the preferred embodiment of this invention, the two NPN transistors 510 and 520 can comprise conventional 2N2222A transistors and the PNP transistor 530 can comprise a 2N3906 transistor.

Although the feedback loop as depicted herein is the mode now preferred for implementing this invention, other configurations and systems can be employed. For example, the reference voltage could first be measured, and after analog to digital conversion, a microcomputer could be employed to compute the appropriate injection current using conventional software techniques. A current source could then be controlled by the microcomputer to inject current in the manner described in conjunction with the preferred embodiment.

Figure 6:
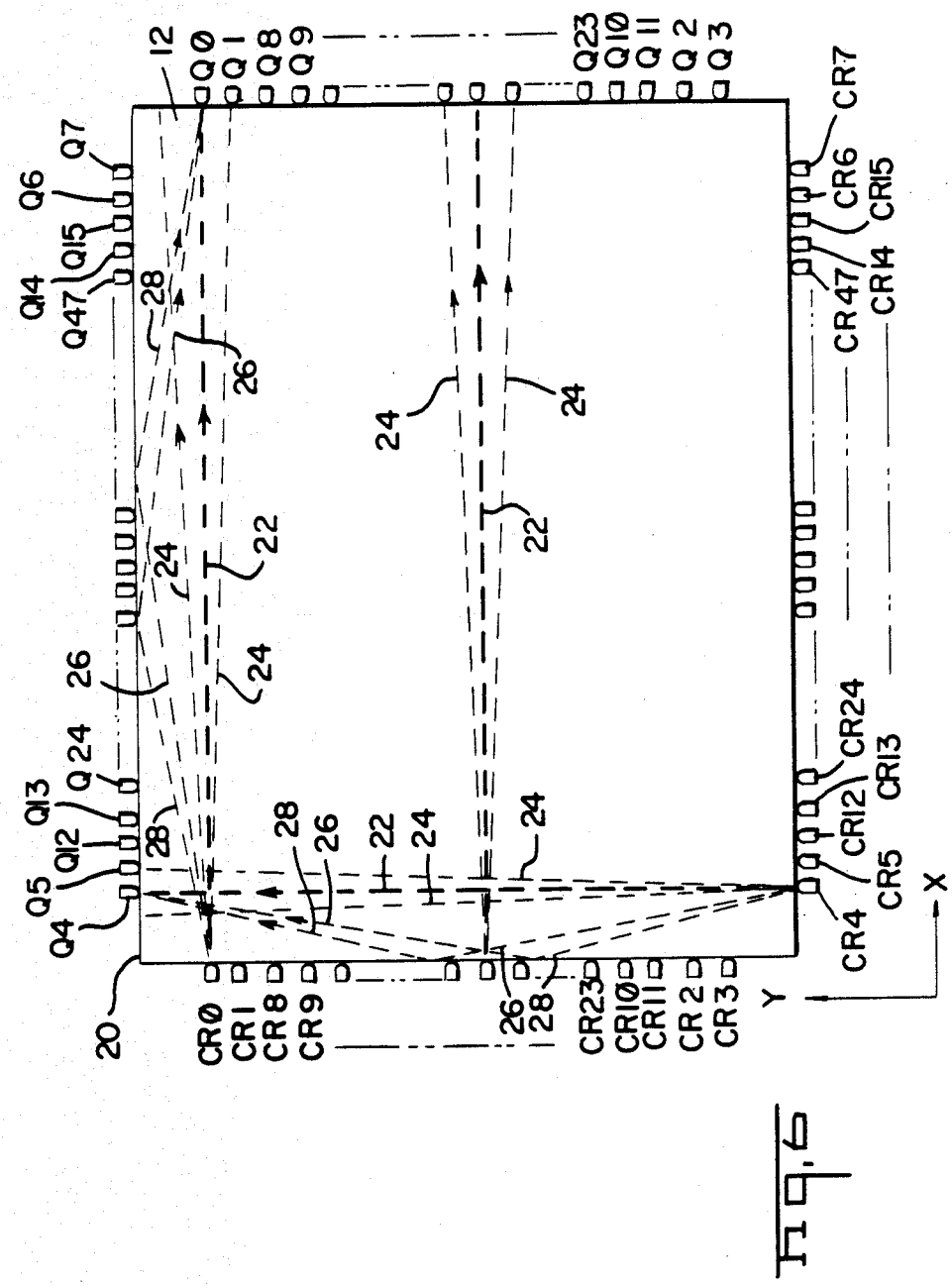
FIG. 6 is a view of a touch entry opto-matrix frame illustrating reflection, glare, and optical dispersion problems in a practical device.

The configuration of emitters Q0 through Q40 and phototransistors CR0 through CR40 in an interactive touch input system is shown in FIG. 6. Individual emitters and detectors are aligned in associated emitter detector pairs. As shown in FIG. 6, the emitters Q0 through Q40 are aligned along two perpendicular sides of the illuminated field. The phototransistors CR0 through CR40 are in turn aligned along the two remaining opposite perpendicular sides. Thus, the emitters are located around the periphery of the illuminated field. In the preferred embodiment shown herein, the emitters and detectors are located in the bezel of an opto-matrix frame which can be mounted on the front of a CRT or other video display. For instance, the emitters and detectors can be affixed to an annular printed circuit board surrounding the illuminated video display. Although the emitters and detectors forming each pair are geometrically aligned, optical alignment is more complicated. Two significant problems are illustrated in FIG. 6. Optical dispersion is illustrated by beams 22, 24. Reflection problems are illustrated by beams 26, 28.

OPERATION OF THE PRESENT DEVICE

Referring now to FIGS. 2, 3, and 4, the overall electrical operation of the present invention as incorporated in the preferred embodiment will be discussed. It is to be remembered that the apparatus of the preferred embodiment interacts with a host computer (not shown) which allows a CRT to present information in a video display area 12 permitting an interactive relationship between the operator 16 and a program or operation such that the opto-matrix touch input screen designates operator decisions to the host computer. It is submitted that the host computer and the programs used with it are conventional and within the scope of one skilled in the art. Therefore, they will not be discussed in detail below. The host computer introduces a clock signal to the clock terminal of FIG. 1, which is received by the C port I/O line PC5 and the interrupt terminal of the microprocessor U2. This clock stream produced by the host computer continues for as long as input from the opto-matrix frame may be desired with the result that upon the absence of a clock signal, an interrupt is initiated in the microprocessor U2. Accordingly, upon appropriate power up and the presence of clock signals to the microprocessor U2, the opto-matrix device begins a scan-type sequence which causes the LEDs to be fired, phototransistors to be read, and internal analysis of the information by appropriate software. Since the operation of the present device is cyclical in nature, a single cycle will be discussed by way of example, although it is to be understood that cycle continues for the remainder of the devices in the same manner.

Upon power up of the microprocessor U2, a main program loop is initiated in software. The software first initializes pointers to begin the X and Y beam count at a known start point of zero. Thereafter, the microprocessor waits for a preset number of synchronizing clock pulses which are received from the host computer, thereby insuring complete synchronization between the microcomputer U2 and the host computer. An X phototransistor, for example Q4, is turned on to the start of the initial cycle in the present example. This turning on of the phototransistor allows the transistor to settle down or stabilize. This is accomplished by selecting the appropriate address for I/O lines PC0, PC1 and PC2 which are presented to decoder U7 which is then enabled by I/O line PC3 which thereby allows current to flow through Q4. The LED CR4 is then fired by energization of I/O line PB0 in conjunction with the address presented by PC0, PC1 and PC2 along with the enabling I/O line PD7 which thereby enables line 4 of decoder U5. This firing of the X LED CR4 also takes into account a wait period so as to insure that the LED CR4 is completely turned on. For LEDs CR0 through CR7, a current-limiting R10 is utilized in conjunction with the Darlington transistor array U3 (used as a source driver) which allows current to flow through emitter CR0 through CR7 at a decreased brightness. Similarly, for emitters CR8 through CR15, a second current-limiting resistor R9 is also utilized so as to diminish the light output of the associated emitters. The remainder of the emitters which are driven by Darlington transistor array U4 do not utilize such current-limiting resistors since full brightness or maximum optical power output is desirable. In this manner, a power profiling is accomplished such that for example, emitters CR0 and CR1 have a reduced optical output power which thereby reduces the reflected beams 26 with the CR8 and 9 having a slightly greater optical power but still less than the remainder of the emitters not adjacent the corners of the bezel 20.

Resistor array R3 is provided as a pull up resistor network to insure that each emitter has minimum proper power for firing. Accordingly, when CR4 is fired, current is caused to flow through the emitter of the lower Darlington transistor pair of array U3 which thereby drives a collector of Darlington transistor array U8 (used as a sink driver) such that the emitter is actively driven and the Darlington transistor array U8 and U9 are actively driven.

After the LED CR4 is completely turned on, a conversion is started which in this example dictates that analog-to-digital line AN0 takes the value produced by Q4 and starts to convert this value to a digital number. This digital number is determined by a reference value which is controlled by the reference divider of Vrh contained on the microprocessor U2 with all signal voltages being ratiometrically converted relative to this reference. It has been determined that this Vrh reference value should be set to Vq where Vq is the maximum voltage input and corresponds to a selected phototransistor or to a selected phototransistor with an extremely low ambient light level. Resistor networks R6 and R7 determine the Vq maximum reference level. During the digital conversion process at 140, the LED CR4 is turned off at 150 with the digital conversion then completed and read and stored in the microprocessor at 160.

The ambient compensation network AC provides an automatic adjustment of the activated signal of the phototransistors Q0 through Q40. This compensation is accomplished by injecting current responsive to ambient conditions at node 110 to adjust the voltage at node 110 or to adjust the voltage across one of the resistors R21, forming the voltage divider network 110, to a constant value. Since the ambient compensation system performs sequentially in conjunction with the sequential excitation of emitter detector pairs, the ambient compensation system will first be described with reference to a single phototransistor when this phototransistor is selected prior to excitation of the associated emitter. Since the phototransistors employed herein have no base terminal, the collector-emitter current through the phototransistor, prior to excitation of the associated emitter, will be a function only of the ambient conditions. Although the ambient temperature and other ambient conditions will affect the current, the principal determinate of the phototransistor current will be the ambient light incident on the phototransistor. Thus, the phototransistor current under ambient conditions will be constant and will not be a function of the potential across the selected phototransistor. The current flowing into the reference node 110 would thus be equal to the current flowing through resistor R20 minus the current flowing through resistors R21 and R22 and minus the current in the phototransistor. This current in the phototransistor is a function of the ambient conditions. Thus, as the ambient current through the phototransistor changes, the current through resistors R20, R21, and R22 would change. The signal chosen to represent the phototransistor output would be the voltage at node 110 or the voltage across resistor R21. The ambient compensation network is adapted to adjust the voltage at node 110, or the voltage across resistor R21 as a function of ambient current through the selected phototransistor by injecting an additional compensation current at mode 110. This additional compensation will not change the current flowing through the phototransistor, which is a function only of ambient conditions, but it will be effective to adjust the voltage at node 110. The preferred node of adjusting the output voltage at 110 is to first generate a signal corresponding to ambient condition. The conventional integrator 200 receives a signal corresponding to ambient condition and compares that signal with a constant supply voltage Vcc.

The output voltage from integrator 200 comprises the input to the sample and hold circuit 300. For each selected phototransistor, during ambient excitation, the switch in the sample and hold circuit is closed. The ambient compensation circuit then acts as a closed loop controller to stabilize the voltage at node 110 at a constant value. Thus, the output voltage of the sample and hold circuit is input into the high impedance buffer 400 which in turn is connected to the current compensation source 500. When the host computer activates the emitter device associated with the selected phototransistor, a corresponding signal is sent to the sample gate 310 of sample and hold circuit opening the analog switch 320. The signal in the sample and hold circuit, then corresponding to ambient conditions, is stored on capacitor 330 during excitation of the associated emitter. Buffer 400 prevents signal droop in capacitor 330. Thus, during excitation of the appropriate LED, occurring simultaneously with selection of corresponding phototransistor, the current source 500 is driven by an ambient signal stored on capacitor 330.

A compensating current driven by supply voltage Vcc is established by regulation of transistor 530 in response to the ambient signal on capacitor 330. The current compensation source transfer function is equal to the output current divided by the voltage across capacitor 330. This compensating current, a function only of ambient phototransistor output, is then injected at the voltage node 110 to adjust the reference voltage at node 110 or across resistor R21. By adjusting this reference voltage to a nominal value centering the operating range of the phototransistor, the entire phototransistor operating range can then be used for signal detection. Thus, the gain on the phototransistor, due solely to the incidence of light from the emitter, can be greater than would be possible without the ambient current compensation. Changing compensating current at node 110 does not affect the output of the phototransistor since the current through the phototransistor is a function only of light incident on the phototransistor base. Ambient compensation for each of the phototransistors can be sequentially performed in the same manner. The analog switch 220 in integrator 200 is used to reduce integrator drift during sample and hold hold-time such that recovery of control conditions for the next sequentially selected phototransistor is minimized. The control for analog switch 220 is common with the control for analog switch 320 with the same polarity action on each.

Processing of the Y axis is accomplished in a manner very similar to that of the X axis. This results in a Y LED being fired for a sufficiently long duration of time to insure complete LED turn-on and photodetection. At this point, processing of the next X coordinate emitter/detector pair is initiated with a repetition of the processing as previously described. In this manner, toggling is accomplished between the X and Y axes until it is determined that there are no more Ys to be interrogated. The remaining X phototransistors are interrogated and the process repeats as long as the host computer continues to send out a clock signal.

It should be remembered that during this entire time frame, the host computer, upon receiving a synchronization signal from microprocessor U2 in a data stream (described more fully below), is required to know in advance the size of the touch input matrix and to keep track of the data stream so as to know which X and Y pair status is being given.

Figure 7:
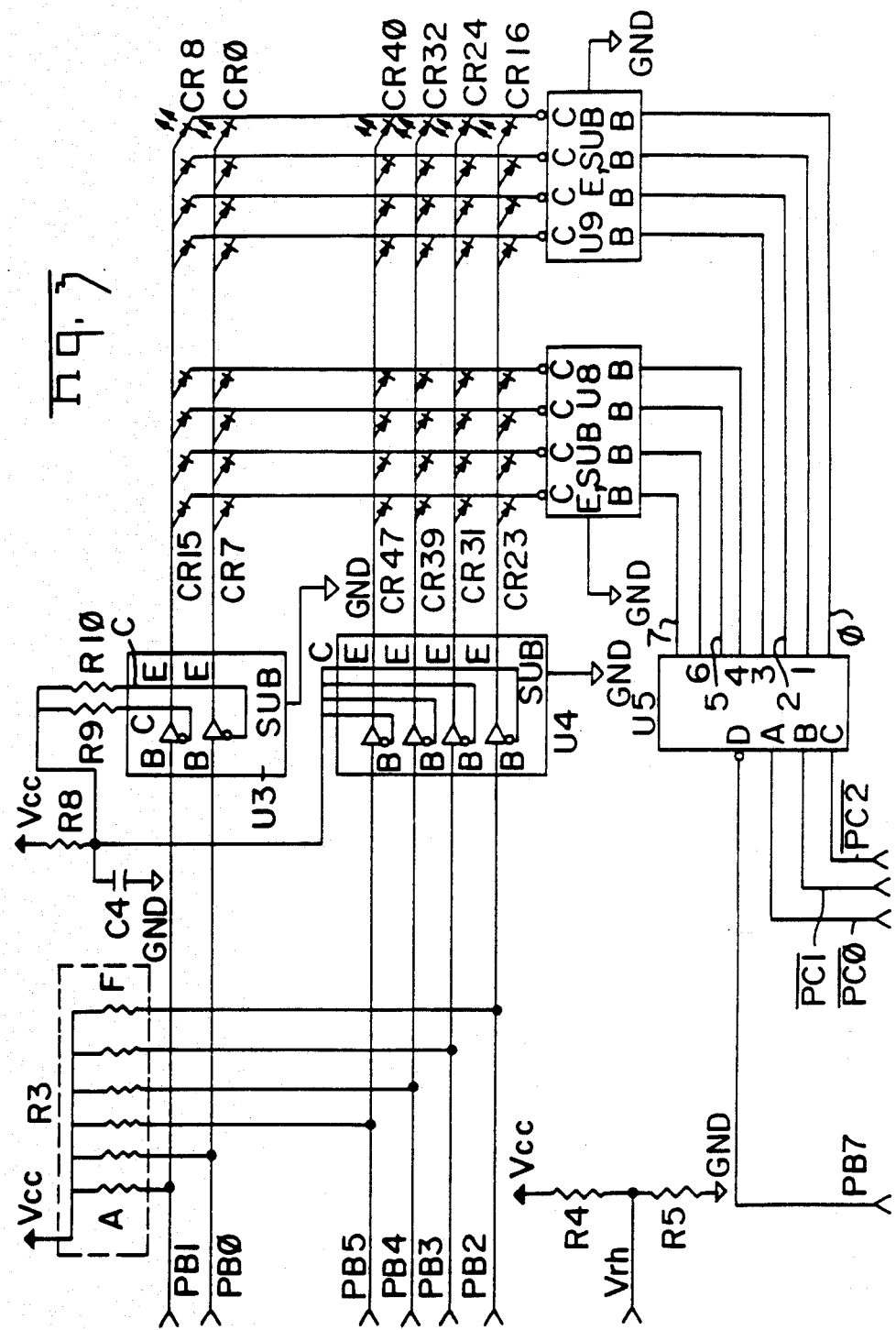
FIG. 7 is a timing diagram of the data output for use with the present invention.

Accordingly, data which represents an X or Y broken or non-broken status condition is presented onto the data line. Therefore, referring now to FIG. 7 there can be seen a timing and data scheme for the present invention. Upon initialization and synchronization, four continuous ones are placed onto the data line for the host computer to receive. This thereby lets the host computer know that a synchronization frame has occurred and that the host computer should now start to count. Thereafter, the data is presented in 4-bit bytes with the first two bits always being zero and the third and fourth bits indicating broken or non-broken conditions for the X and Y axes respectively. If a broken condition does exist, then a 1 is placed onto the data line, and if an unbroken condition exists, then a 0 is utilized. As an example, should a hit occur at the intersection of CR0 and CR4 and since these are the first X and Y pairs interrogated, the first 4-bit byte of data after synchronization will read (0011). However, had a hit occurred at the intersection of CC0 and CR5, then the first 4-bit byte would have contained (0001) and the second 4-bit byte would have contained (0010). For those frames where no Y axis detector is being interrogated, a 0 is preferably inserted as a false bit although a 1 may also be utilized. This 4-bit byte data stream is continued until all the X detectors have been interrogated with the microprocessor U2 sending out the 4-bit sync cycle at the end of the interrogation, thereby indicating a new cycle or frame.

Additionally, the present device will allow for beam averaging, the disclosure of which may be found in U.S. Pat. No. 4,267,443 "Photoelectric Input Apparatus", issued May 12, 1981 to Carroll et al, incorporated by reference herein, and which allows for a stylus between two emitters to be registered as a hit between two beams thereby effectively doubling the resolution or interpolation of the present system to a 32×64 matrix.

It is to be remembered that many variations of the present invention may be accomplished without departing from the spirit and scope of the present invention. For example, the value of the injected compensation current need not be determined by the feedback loop depicted herein. A microcomputer using conventional software can be used to determine the intensity of the injected compensation current.

Accordingly, the present invention produces a device which accommodates for changing ambient light levels, emitter and/or detector degradation and which has few components.

What is claimed:

1. A coordinate detection touch input apparatus for determining the position of a stylus adjacent an electronic display in the presence of ambient light, comprising:

an array of light emitters and phototransistors disposable around the periphery of the electronic display, individual associated emitters and phototransistors aligned in emitter-phototransistor pairs;

means for sequentially activating emitter-phototransistor pairs, each phototransistor being activated for a longer time than the associated emitter, an activated phototransistor current being a function only of ambient conditions, including incident ambient light, when the associated emitter is unactivated;

a dynamic ambient compensation network comprising means for injecting a compensation current at the phototransistor collector during activation of the associated emitter, the compensation current being a function only of the current in the phototransistor due to ambient conditions, including incident ambient light; whereby the presence of the stylus adjacent the electronic display is determined when light from activated emitters is not received by associated phototransistors.

2. The apparatus of claim 1 wherein the ambient compensation network comprises a feedback loop.

3. The apparatus of claim 2 wherein the feedback loop comprises voltage divider means, integrator means, sample and hold means, buffer means and a current compensation source.

4. The apparatus of claim 1 wherein the ambient compensation network comprises means for shifting the operating range of the compensation network to compensate for a wide range of ambient input.

5. The apparatus of claim 1 wherein the ambient compensation network comprises means for maintaining the collector voltage of an activated phototransistor constant, independent of ambient conditions.

6. A coordinate detection touch input apparatus for determining the position of a stylus adjacent an electronic display, comprising:
   an array of light emitters and phototransistors disposable around the periphery of the electronic display, individual associated emitters and phototransistors aligned in emitter-phototransistor pairs;
   means for sequentially activating emitter-phototransistor pairs, each phototransistor being activated for a longer time than the associated emitter, an activated phototransistor current being a function only of ambient conditions when the associated emitter is unactivated;
   voltage divider means for maintaining a potential across the phototransistors, the collector of each phototransistor being connected to elements of the voltage divider means so that the collector voltage remains between ground and a source potential;
   a dynamic ambient compensation network comprising means for injecting a compensation current at the phototransistor collector during activation of the associated emitter to maintain the voltage at the phototransistor collector substantially constant, the compensation current being a function only of the current in the phototransistor due to ambient conditions; whereby
   the presence of the stylus adjacent the electronic display is determined when light from activated emitters is not received by associated phototransistors.

* * * * *